United States Patent
Chien et al.

(10) Patent No.: US 8,291,152 B2
(45) Date of Patent: Oct. 16, 2012

(54) METHOD FOR OPERATING NON-VOLATILE MEMORY AND DATA STORAGE SYSTEM USING THE SAME

(75) Inventors: Jieh-Hsin Chien, Taoyuan (TW); Hsiao-Te Chang, Jhubei (TW)

(73) Assignee: Silicon Motion, Inc., Jhubei (TW)

( * ) Notice: Subject to any disclaimer, the term of this patent is extended or adjusted under 35 U.S.C. 154(b) by 609 days.

(21) Appl. No.: 12/434,671

(22) Filed: May 3, 2009

(65) Prior Publication Data

US 2010/0174852 A1    Jul. 8, 2010

Related U.S. Application Data

(60) Provisional application No. 61/142,930, filed on Jan. 7, 2009.

(51) Int. Cl.
*G06F 13/00* (2006.01)
*G11C 16/00* (2006.01)
*G11C 29/52* (2006.01)

(52) U.S. Cl. . 711/103; 711/154; 711/165; 711/E12.008; 714/710; 714/711; 365/185.09; 365/185.29; 365/200

(58) Field of Classification Search .................. 711/103, 711/154, 165, E12.008; 714/710, 711; 365/185.09, 365/185.29, 200
See application file for complete search history.

(56) References Cited

U.S. PATENT DOCUMENTS

| | | | | |
|---|---|---|---|---|
| 6,249,838 | B1 * | 6/2001 | Kon | 711/103 |
| 2003/0161199 | A1 * | 8/2003 | Estakhri | 365/200 |
| 2003/0227804 | A1 * | 12/2003 | Lofgren et al. | 365/200 |
| 2007/0283428 | A1 * | 12/2007 | Ma et al. | 726/9 |

FOREIGN PATENT DOCUMENTS

CN     1701390 A    11/2005

OTHER PUBLICATIONS

Office Action of corresponding CN application, (Mar. 16, 2011).

\* cited by examiner

*Primary Examiner* — J. H. Hur
(74) *Attorney, Agent, or Firm* — Wang Law Firm, Inc.; Li K. Wang; Stephen Hsu

(57) ABSTRACT

A method for operating a non-volatile memory is provided. The non-volatile memory includes a plurality of physical blocks having a plurality of data blocks and spare blocks. An index is obtained by comparing an average erase count of selected physical blocks with a first threshold. Each erase count for each physical block is the total number of the erase operations performed thereon. A performance capability status for the memory is determined according to the index. The performance capability status is set to a first status when the average erase count exceeds the first threshold. An indication is generated based on the performance capability status. A limp function is performed in response to the first status for configuring a minimum number of the at least some spare blocks reserved and used for data update operations.

19 Claims, 4 Drawing Sheets

METHOD FOR OPERATING NON-VOLATILE MEMORY AND DATA STORAGE SYSTEM USING THE SAME

CROSS REFERENCE TO RELATED APPLICATIONS

This application claims priority of U.S. Provisional Application No. 61/142,930, filed on Jan. 7, 2009, the entirety of which is incorporated by reference herein.

BACKGROUND OF THE INVENTION

1. Field of the Invention

The invention relates to non-volatile memories, and more particularly to methods for operating non-volatile memories and a data storage system using the same.

2. Description of the Related Art

Generally, non-volatile memories have advantages such as high memory density, low power consumption and shock resistance. Thus, non-volatile memory devices, e.g. NAND flash memory devices, are widely used as storage media, such as secure digital (SD) cards, compact flash (CF) cards, pen drives, and solid state disks (SSD). Moreover, many portable devices, such as personal digital assistants (PDA) or notebooks are also accommodated to use such flash memory devices as main storage media, rather than mechanical hard drives.

However, non-volatile memory blocks of non-volatile memories have a limited number of erase cycles, wherein the number of erase cycles for multi-level cell (MLC) memory blocks are less than the number of erase cycles for single-level cell memory blocks. When an erase operation can not be performed on a given block within the non-volatile memory, the given block becomes a defective block and a read-only block.

Therefore, it is desirable to provide a method for operating non-volatile memories, to extend the operating lifespan thereof. Additionally, a method for operating non-volatile memories is desirable to be utilized to notify users of the performance capability of non-volatile memories so that appropriate actions, such as backing up of data thereon, may be performed before data is lost.

BRIEF SUMMARY OF THE INVENTION

The invention provides a method for operating a non-volatile memory. In an embodiment, the non-volatile memory includes a plurality of physical blocks having a plurality of data blocks and a plurality of spare blocks. The data blocks are used for storing data and at least some spare blocks corresponding to the data blocks are reserved and used for data update operations. The method includes the steps of: obtaining an index by comparing an average erase count of selected physical blocks with a first threshold; determining a performance capability status for the non-volatile memory according to the index, wherein the performance capability status is set to a first status when the average erase count exceeds the first threshold; generating an indication based on the performance capability status; and performing a limp function in response to the first status, wherein the limp function is used to configure a minimum number of the at least some spare blocks reserved and used for data update operations.

In addition, the invention provides a method for operating a non-volatile memory. According to an embodiment, the non-volatile memory includes a plurality of physical blocks having a plurality of data blocks and a plurality of spare blocks. The data blocks are used for storing data and at least some spare blocks corresponding to the data blocks are reserved and used for data update operations. The method includes the steps of: generating an index according to a total number of spare blocks other than the at least some spare blocks corresponding to the data blocks reserved and used for data update operations; displaying an indication according to the index; and performing a limp function when the indication is in a first status, wherein the limp function is used to configure a minimum number of the at least some spare blocks reserved and used for data update operations.

In addition, the invention provides a data storage system including a memory module and a host. The memory module further includes a non-volatile memory and a controller. The non-volatile memory includes a plurality of physical blocks having a plurality of data blocks and a plurality of spare blocks. The data blocks are used for storing data and at least some spare blocks corresponding to the data blocks are reserved and used for data update operations. The controller is coupled to the non-volatile memory for obtaining an average erase count of selected physical blocks. Each erase count for each physical block is the total number of the erase operations performed thereon. The host is coupled to the memory module for obtaining an index by comparing the average erase count with a first threshold, and determining a performance capability status for the non-volatile memory according to the index. In one embodiment, the performance capability status is set to a first status when the average erase count exceeds the first threshold. The host further generates an indication based on the performance capability status and performs a limp function in response to the first status. The limp function is to configure a minimum number of the at least some spare blocks reserved and used for data update operations.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
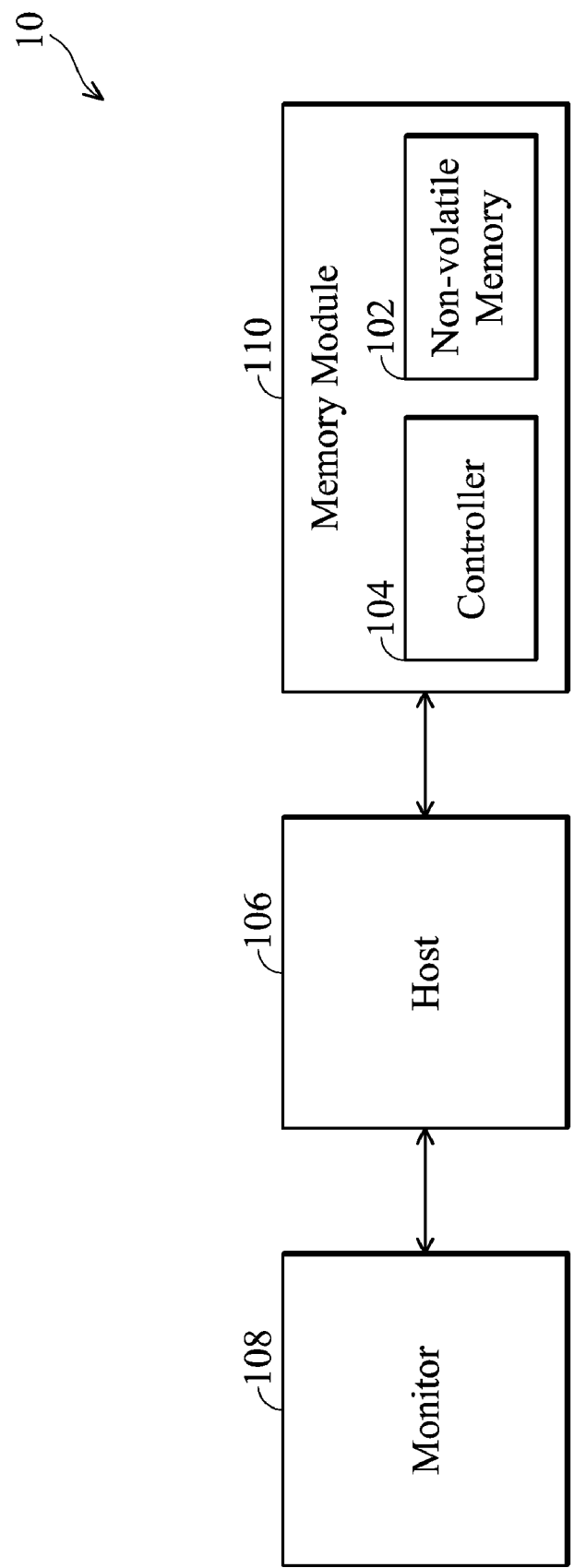
FIG. 1 is a block diagram illustrating a data storage system according to an embodiment of the invention.

FIG. 1 is a block diagram illustrating a data storage system 10 according to an embodiment of the invention. The data storage system 10 comprises a memory module 110, a host 106 and a monitor 108. The memory module 110 includes a controller 104 and a non-volatile memory 102, e.g., an NAND flash memory.

According to an embodiment, the non-volatile memory 102 comprises a plurality of physical blocks, such as multi-level cell memory blocks, which may comprise a plurality of data blocks, a plurality of spare blocks and a plurality of defective blocks. For example, when the non-volatile memory 102 is first used, it contains physical blocks of (X+Y+Z). It is noted that X represents a total number of data blocks, Y represents a total number of spare blocks and Z represents a total number of defective blocks. The data blocks are used for storing data. The defective blocks inhibit erasing or programming access. Further, at least some spare blocks corresponding to the data blocks are reserved and used for data update operations and the remaining spare blocks other than the at least some spare blocks reserved and used for data update operations are used for maintaining performance capability of the non-volatile memory 102. For example, the remaining spare blocks may be provided to replace bad or defective blocks during read or write operations. The defective blocks may be generated during manufacturing or due to excessive erase operations performed thereon. Generally, Z is much smaller than X or Y in the beginning. But as erase operations performed on the non-volatile memory 102 for data writing increases, more and more data blocks or spare blocks may become defective blocks due to excessive erase operations.

In such a case, when a spare block is defective due to excessive erase operations, the spare block is marked as a defective block. Thus, the total number of spare blocks becomes (Y−1) and the total number of defective blocks becomes (Z+1). In another case, when a data block is defective, then a corresponding spare block is used as the data block to maintain the size of the data blocks. Thus, the total number of data blocks remains at X, while the total number of spare blocks becomes (Y−1) and the total number of defective blocks becomes (Z+1).

Accordingly, when the number of defective blocks is increased to a high level, performance error or data lost of the non-volatile memory 102 may occur due to insufficient spare blocks. In this case, some conditions of the non-volatile memory 102 may be utilized to obtain an index for determining whether the performance capability of the non-volatile memory 102 is adequate. For example, the host 106 may execute a software program to determine the operating lifespan or a performance capability status of the memory module 110 according to the initial defective blocks, current defective blocks, initial spare blocks, current spare blocks, erase count of all or several physical blocks, or other conditions of the non-volatile memory 102.

Figure 2:
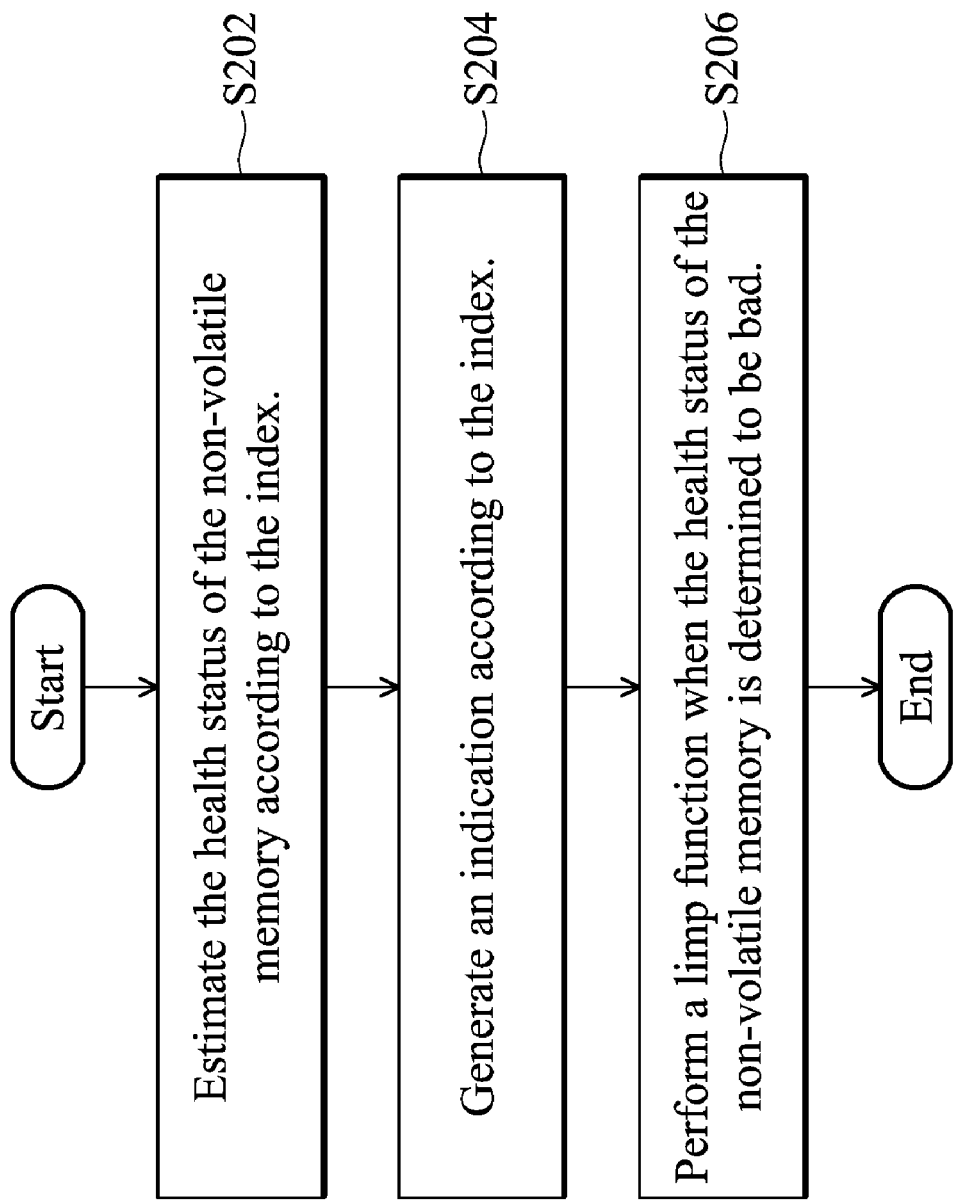
FIG. 2 is a flowchart illustrating a method for operating a non-volatile memory according to an embodiment of the invention.

FIG. 2 is a flowchart illustrating a method for operating a non-volatile memory according to an embodiment of the invention. As shown in FIGS. 1 and 2, when the data storage system 10 incorporated with storage media (e.g., the memory module 110) is powered on, one or more of the aforementioned conditions are provided to the host 106 to obtain the index, so as to detect or estimate the performance capability status of the non-volatile memory 102 (step S202).

For example, the controller 104 coupled to the non-volatile memory 102 may obtain an average erase count of selected physical blocks within the non-volatile memory 102 for determining performance capability. Note that each erase count for each selected physical block is the total number of the erase operations performed thereon.

In this case, the host 106 coupled to the memory module 110 then obtains an index regarding the average erase count of the selected physical blocks. In one embodiment, the average erase count may be derived by averaging total erase counts of the selected physical blocks. During operation, the host 106 obtains the index by comparing the average erase count with a first threshold. Next, an indication is generated based on the index. The monitor 108 coupled to the host 106 is provided for displaying the indication (step S204). Moreover, the host 106 may execute a software program to extend the operating lifespan of the non-volatile memory 102 when the performance capability status of the non-volatile memory 102 is determined to be inadequate. For example, the software program may perform a limp function which loads a special ISP code from the non-volatile memory 102 to the controller 104 for a special performance capability to maintain the normal read or write operations of the non-volatile memory 102 (step S206). The operation of the limp function will be described below in detail with reference to FIGS. 3 and 4.

Figure 3:
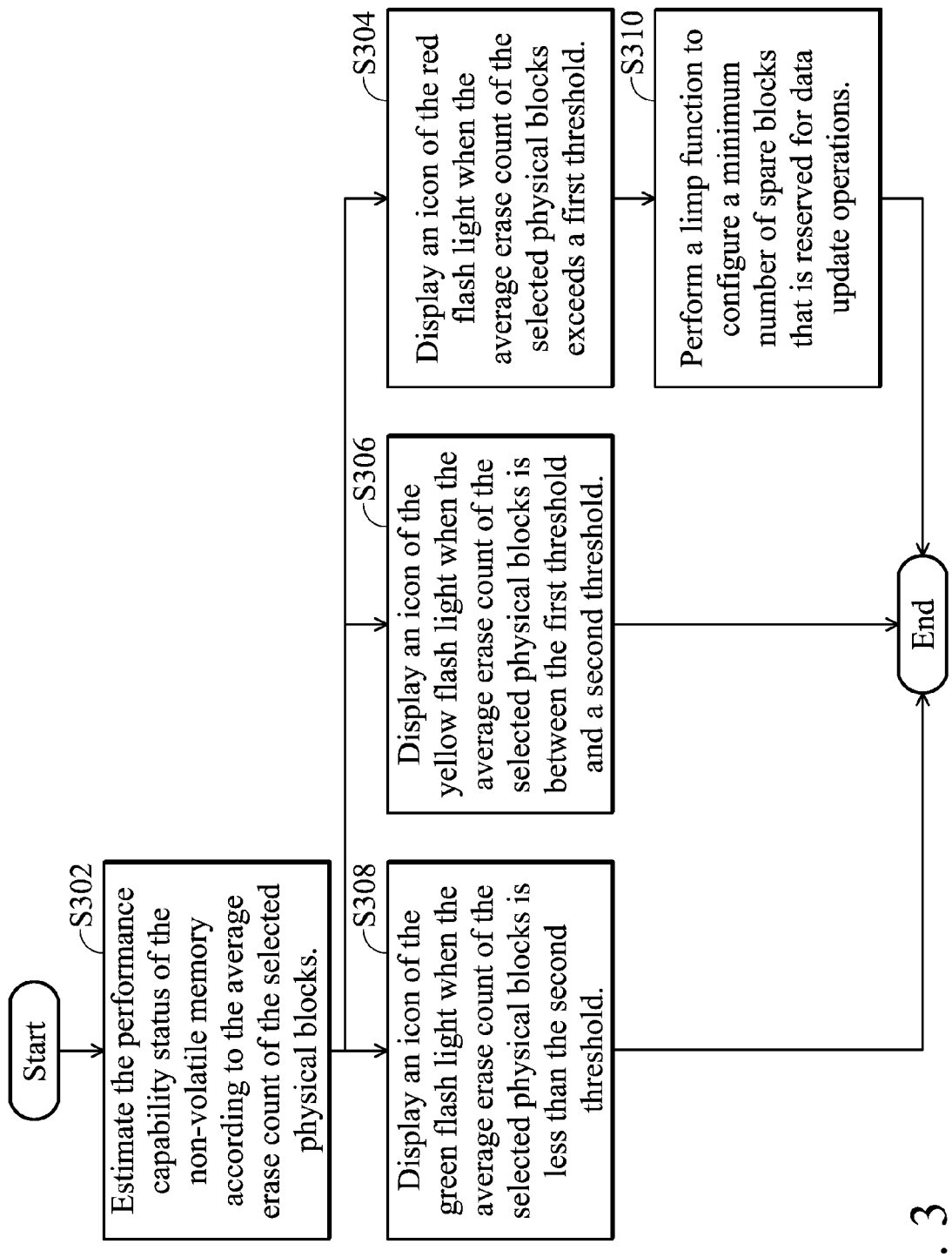
FIG. 3 is a flowchart illustrating another method for operating a non-volatile memory according to the embodiment of FIG. 2.

FIG. 3 is a flowchart illustrating another method for operating a non-volatile memory according to the embodiment of FIG. 2. In this illustrated embodiment, an average erase count of the selected physical blocks within the non-volatile memory 102 (as shown in FIG. 1) is provided to determine the index for determining performance capability.

For example, when the host 106 intends to write data into a physical block B1 having an erase count C1, the controller 104 in FIG. 1 erases the physical block B1. Thus, the erase count of the physical block B1 becomes (C1+1). Since excessive erase operations of one physical block result in a significantly large erase count, the host 106 may select some physical blocks to obtain the average erase count for estimating the performance capability status of the non-volatile memory 102 (step S302).

Further, the host 106 then determines the index by comparing the average erase count with a first threshold. The host 106 determines a performance capability status for the non-volatile memory 102 by the index. After the performance capability status is determined, an indication is generated based on the performance capability status. For example, when the average erase count exceeds the first threshold, the performance capability status may be set to a first status indicating the non-volatile memory 102 is prone to be defective and the data stored in the memory module 10 may be lost in the near future. As such, the indication may be displayed by a red flashing light signal color on the monitor 108, such as an icon of the red flash light, in response to the first status, so as to inform end users to perform a backup operation on the non-volatile memory 102 as soon as possible for preventing data lost (step S304). During the backup operation, the host 106 then instructs the controller 104 to backup stored data of the non-volatile memory 102.

Alternatively, when the average erase count is below the first threshold, the host 106 further obtains the index by comparing the average erase count with a second threshold. In this case, the indication is then displayed by two flashing light signals alternating between a yellow color and a green color based on the compared result of the average erase count and the second threshold. That is, when the average erase count is between the first threshold and the second threshold, the indication is displayed by the yellow flashing light signal color on the monitor 108, such as an icon of the yellow flash light, which indicates that the memory module 110 has been used for a while and the performance capability thereof has been deteriorated (step S306). When the average erase count is less than second threshold, the indication is displayed by the green flashing light signal color on the monitor 108, such as an icon of the green flash light, indicating that the performance capability of the memory module 110 is adequate (step S308).

As mentioned above, the limp function is performed to extend the operating lifespan of the data storage of the non-volatile memory 102 in response to the red flashing light signal color or the first status. The limp function is used to configure a minimum number of spare blocks that is reserved for data update operations. The spare blocks reserved for data update operation with original data blocks are so called pair blocks. The minimum number of spare blocks means the minimum number of pair blocks. The minimum number of spare blocks can maintain normal operation of the memory module 110, but may affect performance of memory module 110. For example, if the number of spare blocks originally corresponding to the data blocks reserved and used for data update operations is set to N, the limp function may decrease N to the minimum number of M that allows the controller 104 to maintain normal operations (step S310).

Additionally, assuming that the total number of spare blocks is Y, after the limp function is performed, there are (Y–M) spare blocks available for replacing any defective data blocks or any defective spare blocks, thereby achieving increased operating lifespan of the memory module 110. It is noted that the first threshold and the second threshold are programmable. During operation, the first threshold and the second threshold may be determined according the memory type of the non-volatile memory 102 or be programmed by software application. For example, the first threshold or the second threshold of a single-level cell (SLC) memory may be greater than that of a multi-level cell (MLC) memory since the single-level cell memory allows a larger erase count than the multi-level cell memory. Therefore, the end user can program the first threshold and the second threshold according to their experiences or requirements, so as to establish the indication more appropriately.

It is noted that the memory module 110 may comprise a secure digital (SD) cards, a compact flash (CF) card, solid state disks (SSD), and other memory devices related to non-volatile memories.

Figure 4:
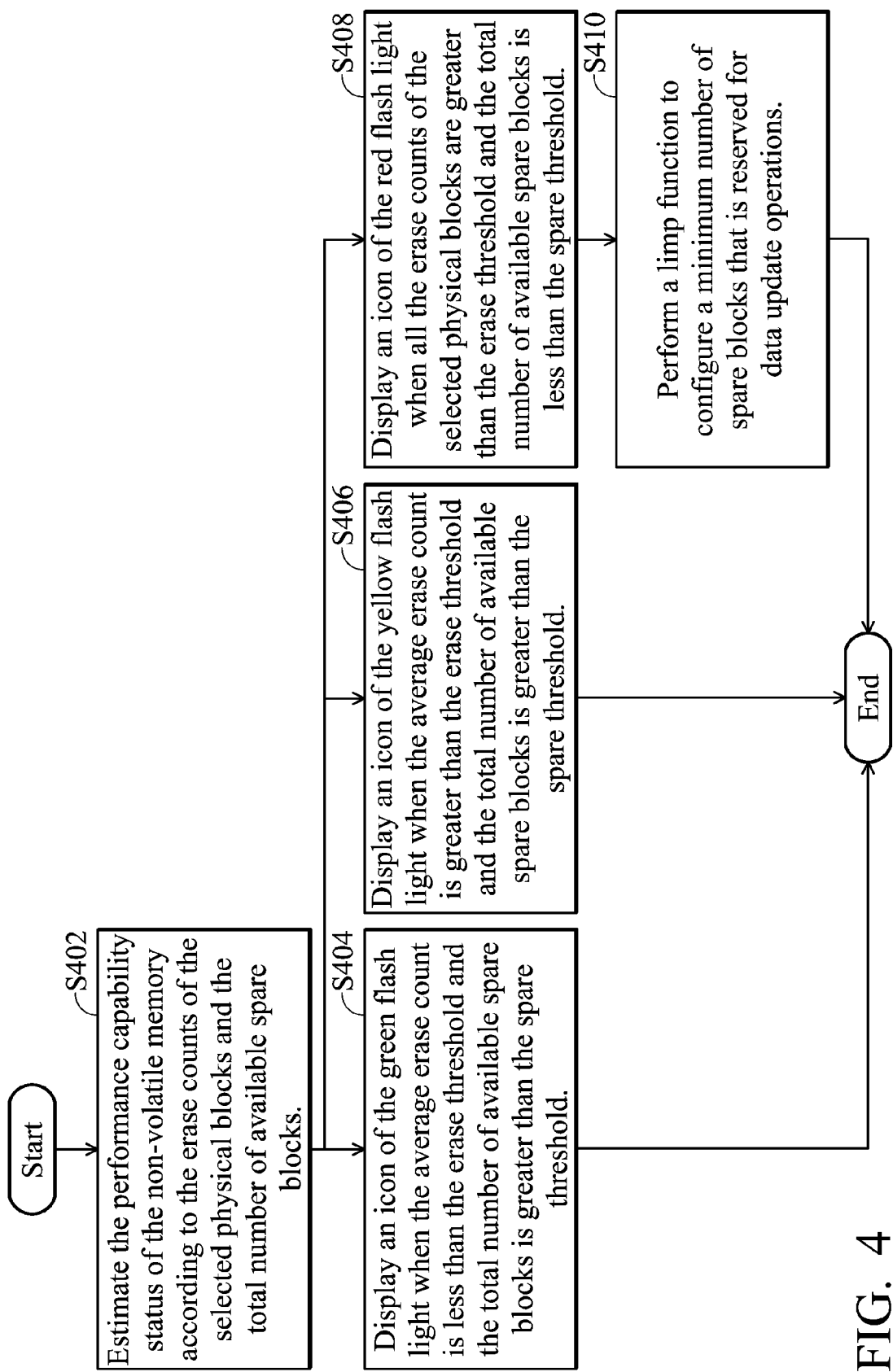
FIG. 4 is a flowchart illustrating another method for operating a non-volatile memory according to the embodiment of FIG. 2.

FIG. 4 is a flowchart illustrating another method for determining performance capability of a non-volatile memory according to the embodiment of FIG. 2. In this illustrated embodiment, in addition to the erase counts associated with the selected physical blocks, the total number of available spare blocks of the non-volatile memory 102 in FIG. 1 is also provided to determine the index for determining performance capability.

Referring to FIGS. 1 and 4, when the data storage system 10 is booted up, the host 106 activates the software program to check the performance capability status of the memory module 110. More specifically, the host 106 first calculates the average erase count of the selected physical blocks. Next, the host 106 counts the total number of spare blocks other than the spare blocks that correspond to the data blocks reserved and used for data update operations. For example, assuming that that the total spare blocks are equal to Y and the number of spare blocks reserved for data update operations is N, then the total number of remaining or available spare blocks is determined to be (Y–N). Following, the host 106 obtains the index by comparing the average erase count with an erase threshold and comparing the total number of available spare blocks with a spare threshold (step S402).

Note that the spare threshold and the erase threshold are programmable via the software application or may be determined according to the memory type of the non-volatile memory 102. For example, the spare threshold and the erase threshold may be obtained from a look-up table according to a flash ID or a flash vendor specification.

During operation, when the average erase count is less than the erase threshold and the total number of available spare blocks is greater than the spare threshold, it is determined that the memory module 110 is operating at an adequate. Thus, the indication corresponding to the safe status is displayed by the green flashing light signal color on the monitor 108, such as an icon of the green flash light, to indicate an acceptable performance capability status of the memory module 110 (step S404).

Further, when the average erase count is greater than the erase threshold and the total number of available spare blocks is greater than the spare threshold, the memory module 110 is determined to be operating at an unstable status. And, the indication corresponding to the safe status is displayed by the flashing light signal of the yellow color on the monitor 108, such as an icon of the yellow flash light, to indicate that the performance capability status of the memory module 110 has been deteriorated (step S406).

According to other embodiments, when the total number of available spare blocks is less than the spare threshold, the host 106 may check whether each erase count of the selected physical blocks is greater than the erase threshold. When all the erase counts of the selected physical blocks are greater than the erase threshold, the performance capability status is set to a warning status indicating the non-volatile memory 102 is prone to be defective (step S408). In this case, the data stored in the memory module 10 may be lost in the near future. From the aforementioned description, the indication is displayed by a red flashing light signal color on the monitor 108 in response to the warning status, so as to remind the end users to backup the stored data of the non-volatile memory 102. According to an embodiment, end users may click an icon of the red flash light on the monitor 108 to direct the data storage system 10 enter a limp mode or implement the limp function (step S410). As mentioned above, the limp function is used to configure a minimum number of spare blocks that is reserved for data update operations. Thus, the number of spare blocks corresponding to the data blocks reserved and used is reduced and more free spare blocks are thus emptied for replacing the bad blocks. In addition, the non-volatile memory 102 may be configured to run at a slower clock speed, thereby allowing the end user to backup the stored data before the non-volatile memory 102 becomes unusable. As a result, the controller 104 may safely operate the memory module 110 for a time period until no spare blocks are available for replacing the bad blocks, and the end users have more time to back up the non-volatile memory 102 before data is lost.

Note that other conditions may be set or combined to derive the index for determining performance capability of the memory module 110. For example, the memory module 110 may be determined to be operated at the warning status when the total number of available spare blocks is less than the spare threshold. Further, when the total number of available spare blocks is greater than or equal to the spare threshold, the host 106 may compare each erase count of the selected physical blocks with the erase threshold. When all of the erase counts are less than the erase threshold, the memory module 110 may be determined to be operating at an adequate status. Otherwise, when some of the selected physical blocks are provided with greater erase counts than the erase threshold, the memory module 110 may be determined to be operating at an inadequate status.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for operating a non-volatile memory having a plurality of physical blocks, which comprise a plurality of data blocks and a plurality of spare blocks, wherein the data blocks are used for storing data, and at least some spare blocks corresponding to the data blocks are reserved and used for data update operations, comprising:
   obtaining an index by comparing an average erase count of selected physical blocks with a first threshold;
   determining a performance capability status for the non-volatile memory according to the index, wherein the performance capability status is set to a first status when the average erase count exceeds the first threshold;
   generating an indication based on the performance capability status; and
   performing a limp function in response to the first status, wherein the limp function is used to configure a minimum number of the at least some spare blocks reserved and used for data update operations.

2. The method according to claim 1, wherein when the average erase count is below the first threshold, the index is obtained by comparing the average erase count with a second threshold.

3. The method according to claim 2, wherein the indication is displayed by two flashing light signals alternating between a yellow color and a green color based on the compared result of the average erase count and the second threshold.

4. The method according to claim 1, wherein the index is obtained by comparing the average erase count with the first threshold and comparing a third threshold with a total number of spare blocks other than the at least some spare blocks corresponding to the data blocks reserved and used for data update operations.

5. A method for operating a non-volatile memory having a plurality of physical blocks, which comprise a plurality of data blocks and a plurality of spare blocks, wherein the data blocks are used for storing data, and at least some spare blocks corresponding to the data blocks are reserved and used for data update operations, comprising:
   generating an index according to a total number of spare blocks other than the at least some spare blocks corresponding to the data blocks reserved and used for data update operations;
   displaying an indication according to the index; and
   performing a limp function when the indication is in a first status, wherein the limp function is used to configure a minimum number of the at least some spare blocks reserved and used for data update operations.

6. The method according to claim 5, wherein the index is further generated according to an average erase count of selected physical blocks.

7. The method according to claim 6, wherein the average erase count of selected physical blocks is larger than a first threshold.

8. The method according to claim 5, wherein the total number of spare blocks is less than a spare threshold.

9. The method according to claim 5, wherein the indication is displayed by a flashing light signal of a red color in response to the first status.

10. The method according to claim 5, further comprising:
    performing a backup operation on the non-volatile memory in response to the first status for backup user data.

11. A data storage system, comprising:
    a memory module having a non-volatile memory and a controller, wherein the non-volatile memory comprises a plurality of physical blocks having a plurality of data blocks and a plurality of spare blocks, and the data blocks are used for storing data and at least some spare blocks corresponding to the data blocks are reserved and used for data update operations, and the controller coupled to the non-volatile memory for obtaining an average erase count of selected physical blocks, wherein each erase count for each physical block is the total number of the erase operations performed thereon; and
    a host coupled to the memory module for obtaining an index by comparing the average erase count with a first threshold, determining a performance capability status for the non-volatile memory according to the index, wherein the performance capability status is set to a first status when the average erase count exceeds the first threshold, generating an indication based on the performance capability status and performing a limp function in response to the first status, wherein the limp function is to configure a minimum number of the at least some spare blocks reserved and used for data update operations.

12. The data storage system according to claim 11, further comprising:
    a monitor coupled to the host for displaying the indication.

13. The data storage system according to claim 11, wherein when the average erase count is below the first threshold, the host obtains the index by comparing the average erase count with a second threshold.

14. The data storage system according to claim 13, wherein the indication is displayed by two flashing light signals alternating between a yellow color and a green color based on the compared result of the average erase count and the second threshold.

15. The data storage system according to claim 11, wherein the host obtains the index by comparing the average erase count with the first threshold and comparing a third threshold with a total number of spare blocks other than the at least some spare blocks corresponding to the data blocks reserved and used for data update operations.

16. The data storage system according to claim 11, wherein the host obtains the index by comparing each erase count of the selected physical blocks with the first threshold and comparing a third threshold with a total number of spare blocks other than the at least some spare blocks corresponding to the data blocks reserved and used for data update operations.

17. The data storage system according to claim 16, wherein the performance capability status is set to the first status when each erase count of the selected physical blocks exceeds the first threshold and when the total number is less than the third threshold.

18. The data storage system according to claim 17, wherein the indication is displayed by a flashing light signal of a red color in response to the first status.

19. The data storage system according to claim 18, wherein in response to the first status, the host instructs the controller to perform a backup operation on the non-volatile memory.

* * * * *